United States Patent [19]

Gulla et al.

[11] Patent Number: 5,053,318

[45] Date of Patent: Oct. 1, 1991

[54] PLASMA PROCESSING WITH METAL MASK INTEGRATION

[75] Inventors: Michael Gulla; Prasit Sricharoenchaikit, both of Millis, Mass.

[73] Assignee: Shipley Company Inc., Newton, Mass.

[21] Appl. No.: 353,770

[22] Filed: May 18, 1989

[51] Int. Cl.$^5$ .................................................. G03F 7/12
[52] U.S. Cl. ........................................ 430/315; 430/313; 430/323; 430/324; 430/325; 430/326; 156/643
[58] Field of Search ............... 430/313, 315, 323, 324, 430/325, 326, 317; 156/643; 427/304, 305

[56] References Cited

U.S. PATENT DOCUMENTS

| | | | |
|---|---|---|---|
| 3,772,056 | 11/1973 | Polichette | 430/153 |
| 3,772,078 | 11/1973 | Polichette | 430/153 |
| 3,930,963 | 1/1976 | Polichette | 430/153 |
| 3,993,802 | 11/1976 | Polichette | 430/153 |
| 4,230,788 | 10/1980 | Spiertz et al. | 430/153 |
| 4,357,369 | 11/1982 | Kilichowski et al. | 427/90 |
| 4,388,351 | 6/1983 | Sawyer | 427/304 |
| 4,396,704 | 8/1983 | Taylor | 430/311 |
| 4,426,247 | 1/1984 | Tamamura et al. | 156/643 |
| 4,430,153 | 2/1984 | Gleason et al. | 156/643 |
| 4,433,044 | 2/1984 | Meyer et al. | 430/271 |
| 4,526,810 | 7/1985 | Nesbitt | 430/315 |
| 4,613,398 | 9/1986 | Chiong et al. | 156/628 |
| 4,748,104 | 5/1988 | Ferrier et al. | 430/315 |
| 4,827,326 | 5/1989 | Altman et al. | 430/317 |
| 4,906,552 | 3/1990 | Ngo et al. | 430/315 |

*Primary Examiner*—Charles L. Bowers, Jr.
*Assistant Examiner*—Kathleen Duda
*Attorney, Agent, or Firm*—Robert L. Goldberg

[57] ABSTRACT

This invention describes methods for altering a substrate in a fine line image pattern using a microlithographic process including formation of a metal mask over a photoresist coating to protect the photoresist coating during dry development of the same. The invention also describes a method for formation of the metal mask. Briefly stated, the process of the invention comprises the steps of coating a substrate with a photoresist coating, exposing the photoresist coating so formed to a desired pattern of actinic radiation, catalyzing the entire surface of the photoresist coating with an electroless plating catalyst, developing the photoresist layer to a depth at least sufficient to remove the undesired catalyst layer in an image pattern, forming a metal pattern on the desired (remaining) catalyst layer and dry developing the remaining photoresist coating unprotected by the metal mask.

44 Claims, 2 Drawing Sheets

PLASMA PROCESSING WITH METAL MASK INTEGRATION

BACKGROUND OF THE INVENTION

1. Introduction

This invention relates to microlithography, and more particularly, to a process of microlithography that uses a photoresist coating protected by a metal mask. Specifically, the invention relates to the formation of a patterned metal mask over a photoresist coating, the use of the mask to dry develop the photoresist coating and/or transfer an image defined by a developed photoresist coating to an underlying substrate.

2. Description of the Prior Art

Recent advances in electronic device fabrication have resulted from improvements in manufacturing techniques, especially improvements in microlithographic methods and methods for transferring patterns from a master to a substrate utilizing a patterned photoresist.

The conventional method for transferring an image pattern of actinic radiation to a substrate, such as a wafer used in semiconductor manufacture, comprises coating the substrate with a light sensitive photoresist, exposing the photoresist coating to said patterned radiation to form a latent image in the photoresist coating, developing the photoresist coating using either wet or dry development techniques, and etching or otherwise treating the substrate to transfer the pattern to the substrate.

Wet development of an exposed photoresist coating involves contact of the coating with a developer that preferentially dissolves (develops) exposed or unexposed areas, dependent upon whether the photoresist used is a positive or negative acting photoresist, to form a relief image in the photoresist coating. Dry development most often involves contact of the photoresist coating with an oxygen containing plasma to generate an image by erosion or ablation of the photoresist in a selective pattern.

For fine line patterning, anisotropic dry development with a reactive ion etch is preferred to wet development because anisotropic etching results in a relief image having vertical side walls. This permits transfer of an image of enhanced resolution to an underlying substrate. Following formation of the relief image in the photoresist coating, whether by wet or dry development, the bared underlying substrate may be treated by art recognized processes.

Photoresists used in processes of the above type are organic polymers often containing a separate light sensitive component. Contact of an organic coating with an oxygen plasma causes erosion or ablation of all surfaces of the coating contacted by the plasma stream. For this reason, to create an image pattern in a photoresist coating by dry development with a plasma, the photoresist coating must have areas that are plasma resistant and other areas that are not plasma resistant, the plasma resistant areas and the areas subject to attack by the plasma defining the desired image pattern.

Methods for dry development of photoresist coatings in an image pattern are known in the art. For example, a known method for formation of a plasma resistant photoresist coating in an image pattern involves use of a photoresist containing silicon as part of the photoresist composition in sufficient quantity whereby following exposure to patterned activating radiation and upon contact with a plasma, a silicon oxide mask is formed over the surface of the photoresist, the silicon oxide mask functioning as a patterned protective layer that limits erosion of those portions of the photoresist coating underlying the silicon oxide mask.

A method for generating a pattern in a photoresist coating using a technique similar to that described above is disclosed in U.S. Pat. No. 4,430,153. The method disclosed in this patent involves formation of an etch barrier over a photoresist coating followed by reactive ion etch development. The method comprises coating a surface with a layer of an aromatic polyamic acid; at least partially curing the layer of aromatic polyamic acid to the corresponding aromatic polyimide; in situ converting the surface layer of the aromatic polyimide to a silicon containing alkyl polyamide/imide; applying, exposing and wet developing a layer of photoresist over the silicon containing alkyl polyamide/imide, to selectively expose a portion of the silicon containing alkyl polyamide/imide surface layer; reactive ion etching the exposed portion of the surface layer of the silicon containing alkyl polyamide/imide with carbon tetrafluoride to remove the exposed portion of the silicon containing alkyl polyamide/imide surface layer; and subsequently using the oxygen etch resistant, silicon containing polyamide/imide polymer as a mask in the processing of underlying layers which can be oxygen reactive ion etched.

An additional method for forming a pattern using a technique similar to that described above is disclosed in U.S. Pat. No. 4,426,247. The method comprises the steps of forming a polymer layer on a substrate, forming a silicon layer on the polymer layer, selectively irradiating a surface of the silicon layer with a high energy beam, exposing the surface of the silicon layer to a radical addition polymerizable monomer gas so as to form a graft polymer film on an irradiated portion of the surface of the silicon layer, performing reactive ion etching using the graft polymer film as a mask so as to form a silicon pattern, and a reactive ion etching using the silicon pattern as a mask to protect underlaying organic polymer layers, so as to form an organic polymer pattern.

More recent processes have been developed that permit selective conversion of portions of a nonsilicon containing photoresist to a silicon containing etch resistant mask. In these methods, the nonsilicon containing photoresist is exposed to patterned radiation to create a latent image within the photoresist. The latent image is then reacted with an organo metallic reagent to incorporate an oxide forming element such as a metal or silicon into the image. The metallized or siliconized latent image is then dry developed, and etch resistant images, as well as underlying organic material, if any, can be dry developed using a suitable plasma to sequentially develop and transfer the pattern to a substrate below. Such methods are disclosed in U.S. Pat. No. 4,613,398. As disclosed in said patent, the metallic portion of the organo metallic material can be selected from Group III A metals, Group IV A metals, Group IV B metals, and Group VI B metals. The preferred elemental portions are disclosed as titanium, silicon and tin, with the most preferred being silicon.

The methods used to create dry developable photoresist layers described in U.S. Pat. No. 4,613,398 provide negative patterns. In accordance with the patent, it is also possible to produce a positive pattern. As further disclosed in the patent, several of the methods preferably utilize polymeric materials which initially do not contain a reactive functional group such as hydroxyl, amine, carboxyl, phenol or imide-amine, capable of reacting with an organyl metallic reagent. The reactive functional groups are created within the polymeric material using irradiation or photoactive compounds which are added to the polymeric material and which subsequently react with the polymeric material after exposure to radiation, or combinations thereof. However, these methods encounter difficulties when applied to novolak photoresist materials of the type most commonly used as positive photoresists for microlithography.

Further in accordance with U.S. Pat. No. 4,613,398, to alleviate the difficulties referred to above, and to enable the creation of positive photoresist patterns as well as negative photoresist patterns, an additional method is disclosed that provides for wet development of the latent image created within the photoresist upon exposure to patterned radiation, with subsequent processing to render the photoresist material remaining after development plasma resistant. The plasma resistant photoresist may then be used to transfer the pattern to underlaying polymeric layers.

Additional patents showing dry development of a photoresist coating are shown in the art, for example, a silicon containing photoresist used in a dry development process is disclosed in U.S. Pat. No. 4,433,044. The photoresist of this patent comprises an acrylate and a silicon containing oxime ester of methacrylic acid. A method for selectively dry developing a photoresist coating over a substrate using an oxygen plasma and a photoresist material comprising a poly(silane) sulfone (copolymer) is disclosed in U.S. Pat. No. 4,357,369. A method of producing solid state devices by plasma development of a photoresist film comprising a silicon containing o nonsilicon containing, but organo metallic monomer containing polymer, is described in U.S. Pat. No. 4,396,704.

Though the methods described above yield etch resistant photoresist layers, results are not readily reproducible and the processes are cumbersome, time consuming and costly. Therefore, there is a continuing need for an improved process for providing dry etch resistant masks over photoresists for transfer of micron and submicron images to a substrate.

SUMMARY OF THE INVENTION

In accordance with the present invention, a plasma resistant metal mask is used as a barrier to protect a photoresist coating during dry development of the coating. The invention includes a method for formation of the metal mask using electroless metal deposition procedures. The mask may be in either a negative or positive pattern.

In one embodiment of the invention, a conventional positive or negative acting photoresist is coated onto a surface, and thereafter, in either order, the photoresist coating is catalyzed with an electroless metal plating catalyst and exposed to activating patterned radiation, to form a catalyzed image pattern. Thereafter, at least the top surface of the imaged and catalyzed photoresist coating is wet developed. Development is accomplished with a conventional wet photoresist developer. The step of development removes photoresist in either exposed, or unexposed areas, dependent upon whether a positive acting or a negative acting photoresist has been used. Where portions of the photoresist coating are removed by developer, catalyst adsorbed onto the surface of the developed photoresist coating is removed with dissolved photoresist. Where the photoresist coating remains intact, catalyst remains on the surface of the photoresist coating. The result is a photoresist coating selectively catalyzed to electroless metal deposition in the image pattern. Following development, the selectively catalyzed photoresist coating is metallized using conventional electroless metal deposition procedures. The metal deposit formed by electroless deposition is continuous and capable of functioning as a mask or barrier that protects the underlying photoresist coating against erosion or ablation during a subsequent dry development step. Following electroless deposition, remaining photoresist unprotected by the metal mask is removed by dry development, preferably using an anisotropic reactive ion etchant. The metal mask over the photoresist coating protects the photoresist against attack during dry development. Using anisotropic dry development, there is formed a relief pattern where the features of the relief pattern are defined by vertical side walls known to be advantageous in submicron fabrication. Thereafter, the substrate that has been bared by the previous steps may be processed in an art recognized manner. Processing preferably comprises etching of the surface of the substrate with a plasma. The steps of dry development of the photoresist and dry etching of the substrate may be sequential with etching immediately following dry development.

In the process described above, the steps of applying, imaging and developing the photoresist layer, and the materials used are conventional, though in a preferred embodiment of the invention, variations from conventional processing procedures are possible and desirable.

The first possible variation in the above described process comprises use of a photoresist coating that is thinner than photoresist coatings used in conventional processes because the photoresist is used for patterning, not protection of the material over which the photoresist is coated. In the process of the invention, the metal mask over the photoresist coating protects the photoresist coating during a subsequent dry development step and may also function to protect the underlying substrate during plasma etching. The use of a thin photoresist coating is both an economic advantage and is also advantageous as improved resolution is possible using thin photoresist coatings. In thicker coatings, resolution is lost as a consequence of the range of focus of the image within the coating thickness and the influence of absorption on the image quality resulting in line broadening and concomitant problems in formation of submicron images. In the prior art, there is a minimum thickness required for the photoresist coating as it must protect the underlying substrate and be pinhole free. In accordance with the subject invention, thin photoresist coatings can be used because electroless metal deposition forms deposits that are continuous. Thus, even if pinholes are present in the thin photoresist coating, they are likely to be covered by the electroless metal deposit.

A second possible variation in the process of this invention resides in the steps of imaging, development or a combination of these steps. As described above, it is necessary to form a catalyzed pattern for electroless metal deposition, but only the top surface of the photoresist coating is catalyzed. Therefore, only the top surface of the photoresist coating has to be removed by wet development to obtain a catalytic surface in an image pattern. For this reason, with a positive photoresist, either exposure dose may be reduced whereby only the top surface of the photoresist coating is exposed (as exposure need not be through the entire photoresist layer) or, alternatively, or in combination with reduced exposure dose, development conditions, such as developer concentration, development time and/or developer temperature, developer composition, etc. may be adjusted to remove only the top surface of the exposed photoresist layer. With a negative photoresist, the exposure dose should not be reduced, but development conditions may be altered to remove only the top surface of the photoresist coating. Either way, surface development of the photoresist layer permits reduced processing time, use of highly absorbing photoresists that eliminate standing waves and lithographic variations, and improved image resolution for reasons described above.

The process of the invention may use conventional electroless plating techniques and materials though again, variations from conventional processes are possible. For a process of mask formation, electroless deposition over a catalyzed surface using conditions favoring a thin metal deposit are preferred. A thin deposit is adequate because a metal deposit as thin as 80 angstroms is adequate to protect the photoresist coating during dry development. This is in contrast to conventional electroless plating procedures that generally require a relatively thick deposit (0.05 to 1 mil or greater) because the coventional deposit is most often used for conductivity in circuit manufacture or corrosion resistance as a protective coating. Thin metal deposits are an advantage as they permit reduced plating time or the use of dilute and more controllable plating solutions at reduced temperature and with enhanced edge acuity.

By the processes of the invention, dry development may be used to form developed photoresist images having submicron lines. This permits transfer of these fine line images to an underlying substrate using an additional etch step. The processes of the invention are especially useful for the fabrication of integrated circuits though the processes are also useful for the fabrication of a wide variety of devices.

DESCRIPTION OF THE PREFERRED EMBODIMENTS

Figure 1:
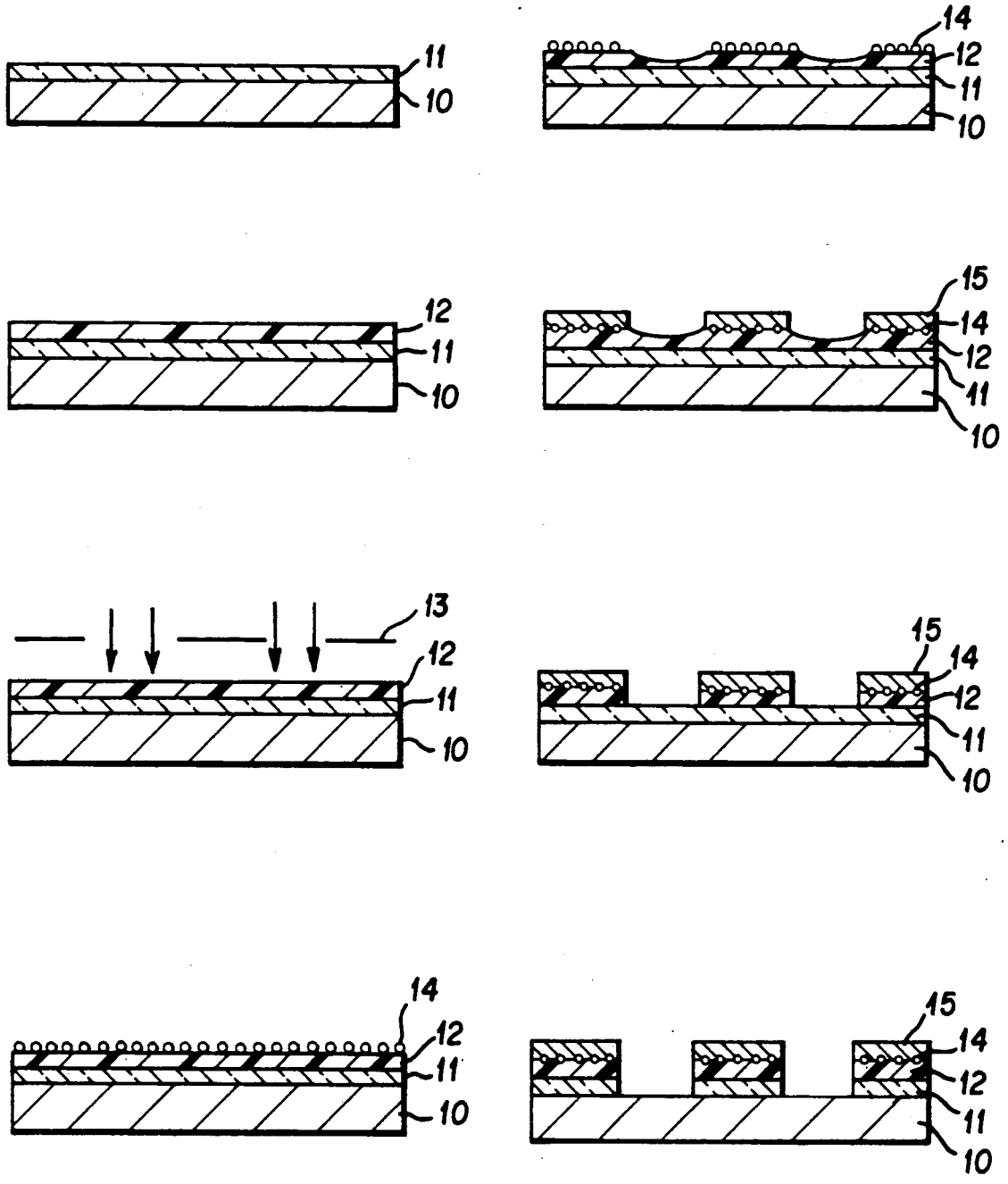
FIG. 1 is a diagrammatic representation of one process of the invention.
Figure 2:
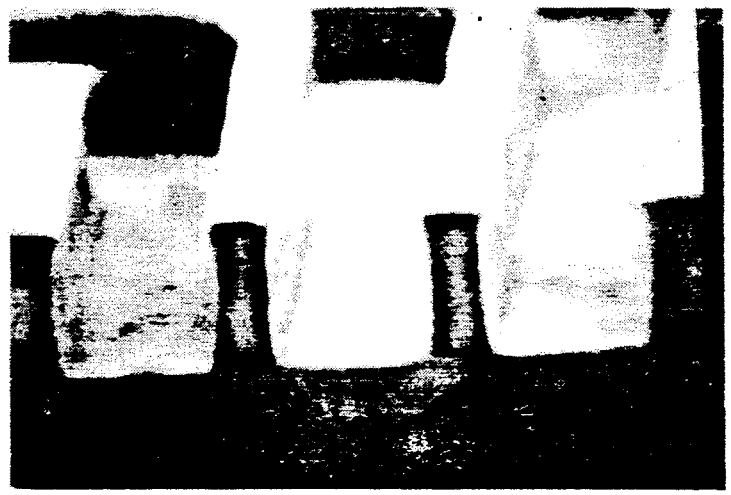
FIG. 2 is a photomicrograph of a plasma developed photoresist coating processed without the metal mask of the invention.
Figure 3:
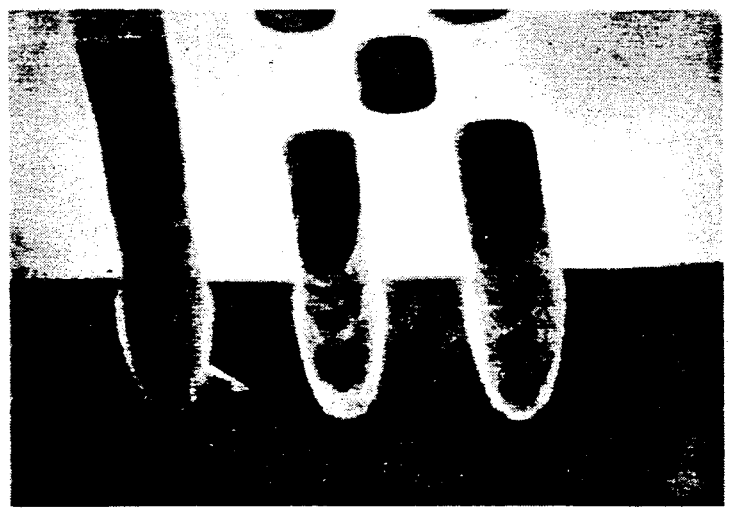
FIG. 3 is a photomicrograph of a plasma developed photoresist coating processed with the metal mask of the invention.

A preferred embodiment of this invention involves procedures using positive acting photoresists comprising a binder of a novolak or polyvinyl phenol resin and a naphthoquinone diazide sulfonic acid ester photoactive compound though it should be understood that many photoresists known to the art are suitable for purposes of the invention. For this reason, the discussion that follows primarily illustrates the use of the preferred photoresist material though the exemplification of this photoresist should not be construed as limiting the invention to this embodiment.

A preferred process of the invention is represented by the following sequence. The sequence is limited to major process steps with minor steps known to the art such as water rinses, surface preparation techniques, preplate techniques, etc. not being shown: p0 1. apply photoresist over substrate to be treated;
2. expose photoresist layer to patterned activating radiation;
3. catalyze imaged photoresist layer;
4. develop photoresist;
5. electrolessly plate metal over patterned catalytic image;
6. dry develop remaining photoresist on substrate; and
7. process underlying substrate.

In the process shown above, Steps 2 and 3 may be reversed.

Step 1 above involves formation of a photoresist coating on a substrate to be subsequently altered. The selection of the substrate is dependent upon the device to be fabricated. For integrated circuit fabrication, the substrate may be a semiconductor, such as silicon which may be covered by a film of oxide, or the substrate may be gallium arsenide. In other applications, the substrate may be a ceramic or a metal such as aluminum.

Fabrication procedures for formation of semiconductor devices are known and described in many publications including *Introduction to Microlithography*, L.F. Thompson, C.G. Wilson, and J.J. Bowden, editors, ACS Press, N.Y. (1983); "The Submicron Lithography Labyrinth", A.N. Broers, Solid State Technology, June 1985, pp. 119 to 126; and M.C. Peckerar, *Materials for Integrated Circuit Process Technology*, Academic Press, 1988, also incorporated herein by reference Typical preparation of a semiconductor substrate for coating with a photoresist comprises application of an adhesion primer to the surface of a substrate such as hexamethyl disilazane, dimethyldichlorosilane, etc.

Following preparation of the substrate, a photoresist is coated onto the surface of the substrate. The photoresist coating may be applied directly to the substrate or over a planarizing layer by conventional methods, such as by spraying, roller coating, spin casting electrostatic spray, etc. Following application of the photoresist coating, the wet coating is dried and/or baked to give a dry film. Drying conditions are known to the art.

In one embodiment of the invention, a planarizing layer is applied to the substrate prior to the application of the photoresist coating. Planarizing layers are known in the art and disclosed in numerous references such as U.S. Pat. Nos. 4,211,834 and 4,370,405, each incorporated herein by reference. The planarizing layer may be light sensitive or light insensitive. It is an advantage to the subject invention that there is greater latitude in the selection of materials for formation of the planarizing layer in accordance with this invention compared to prior art procedures. Typical planarizing layers include polymethyl methacrylate, polyglutarimides, polyimides, novolak resins (with or without light sensitive components), polyvinyl phenols (with or without light sensitive components), spin-on-glass, etc. In general, the planarizing layer may be of any material capable of being plasma etched and noninjurious to the underlying substrate.

The combined thickness of the photoresist layer and the planarizing layer, if used, (the combined layer) may vary between about 0.1 and 500 microns, the lower limit being possible due to the protection afforded the combined layer by the continuous metal mask to be deposited over the combined layer in subsequent steps in the process. The preferred thickness for the combined layer may vary between 0.5 and 50 microns. If a planarizing layer is used, the photoresist component of the combined layer should be sufficient for image formation and may vary within a range of from 0.1 to 5.0 microns with the planarizing layer comprising the balance of the combined layer and the combined layer having the above stated thickness. If a planarizing layer is not used, the photoresist layer may be within the above stated thickness range but preferably varies between 0.1 and 5 microns. Dilute photoresist solutions may be used to obtain the thin coatings suitable for the present invention.

Most positive or negative photoresists known to the art and compatible with compositions used in subsequent processing step are suitable for purposes of the subject invention. Many known photoresists are described in numerous publications including DeForest, *Photoresist Materials and Processes*, McGraw Hill Book Company, New York, Chapter 2, 1975 and Moreau, *Semiconductor Lithography, Princioles, Practices and Materials*, Plenum Press, New York, Chapters 2 and 4, 1988, incorporated herein by reference.

Positive working photoresists suitable for purposes of the invention typically comprise two component systems comprising a light sensitive compound in a film forming polymeric binder where the light sensitive component undergoes photochemical alteration upon exposure. Single component systems typically comprise a polymer that undergoes chain scission upon exposure. The light sensitive compounds most frequently used in two component resist systems are esters and amides formed from o-quinone diazide sulfonic and carboxylic acids, especially from sulfonic acid esters of naphthoquinone diazides. These esters and amides are well known and described by DeForest, supra, pages 47-55 and by Moreau, supra, pages 34-52. The light sensitive compounds and the methods used to make the same, are all documented in prior patents including U.S. Pat. Nos. 3,046,110; 3,046,112; 3,046,119; 3,046,121; 3,106,465, 4,596,763 and 4,588,670, all incorporated herein by reference.

The polymer binders most frequently used for positive working photoresists in conjunction with o-quinone diazides are the alkali soluble phenol formaldehyde resins known as the novolak resins. Photoresists using such polymers are illustrated in U.S. Pat. No. 4,377,631 and 4,404,272. Another class of binders used with o-quinone diazides are homopolymers and copolymers of vinyl phenol. Photoresists of this nature are disclosed in U.S. Pat. No. 3,869,292.

Single component photoresists comprise a polymer that undergoes chain scission. A photoresist using a polyglutarimide polymer as a binder alone or in combination with a photoactive component is disclosed in U.S. Pat. No. 4,246,374 and further in U.S. Pat. No. 4,636,532. A photoresist utilizing polymethyl methacrylate as a single component system is disclosed in U.S. Pat. No. 4,584,309. Polyester and polyketone resists that are single component positive resists are disclosed in U.S. Pat. No. 4,584,309.

Though less preferred, negative working resists are also suitable for purposes of the invention and are well known in the art. Such photoresists typically undergo random cross linking upon exposure to activating radiation thereby forming areas of differential solubility. Such resists often comprise a polymer and a photoinitiator. One class of negative working resists comprise, for example, polyvinyl cinnamates as disclosed by R.F. Kelly, *Proc. Second Kodak Semin. Micro Miniaturization*, Kodak Publication P-89, 1966, p. 31. Other negative acting resists include polyvinylcannamylidene acetates as disclosed in U.S. Pat. No. 2,716,102; azide cyclized rubber as disclosed in U.S. Pat. No. 2,940,853; polymethyl methacrylate tetraacrylate as disclosed in U.S. Pat. No. 3,149,975; polyimide-methyl methacrylate as disclosed in U.S. Pat. No. 4,180,404; and polyvinyl phenol azide as disclosed in U.S. Pat. No. 4,148,655.

Another preferred class of photoresists for purposes of the invention are those positive and negative acid hardening resists disclosed in EPO application Ser. No. 0,232,972 in the name of Feely et al. These photoresists comprise:

(a) an acid-hardening resin;
(b) an aminoplast or phenolplast; and
(c) a halogenated, organic, photoacid generating compound which:
  (i) selectively absorbs actinic radiation having a wavelength in the range of about 350 nm or less,
  (ii) is compatible with the acid hardening resin and the aminoplast or phenolplast;
  (iii) is developable in an aqueous based solution;
  (iv) is capable, on exposure to actinic radiation having a wavelength in the range of about 350 nm or less, of generating halogen acid for cross linking the acid-hardening resin system at elevated temperatures to form a thermally stable negative image.

The EPO application discloses the acid hardening resin and the aminoplast or phenolplast as an acid hardening system. Novolak resins and polyvinyl phenol resins are disclosed as suitable acid hardening components of the acid hardening resin system. A complete disclosure of the acid hardening resin systems is disclosed in detail in EPO application No. 0164248, incorporated herein by reference. Suitable acid hardening resin systems that can be combined with the photoacid generators described in the EPO application contain a polymer that cross links in the presence of an acid catalyst and heat. As described in the EPO application, the acid hardening resin system may be prepared from a variety of aminoplasts or phenolplasts in combination with compounds of low molecular weight polymers containing a plurality of hydroxyl, carboxyl, amide or imide groups. Suitable aminoplasts include urea formaldehyde; melamine formaldehyde; benzoguanamine formaldehyde; glycouril formaldehyde resins; and combinations thereof.

In accordance with the EPO application, the aminoplasts are used in combination with a reactive hydrogen containing compound such as a novolak resin; polyvinylphenol; polyglutarimide; poly(meth)acrylic acid copolymer; alkali soluble polyacrylamide and polymethacrylamide copolymers; copolymers containing 2-hydroxyethyl acrylate or methacrylate; polyvinyl alcohols such as those prepared from partially hydrolyzed polyvinyl acetate; alkali soluble styrene allyl alcohol copolymers; and mixtures thereof. Preferred reactive hydrogen containing resins in both the EPO application and the subject invention are novolak resins and polyvinyl phenol resins containing hydroxyl groups, sites for the electrophillic substitution of aromatic rings at positions ortho or para relative to the hydroxyl group.

Suitable halogenated, organic, photoacid generating compounds disclosed in the EPO application as suitable for use with the acid hardening resin systems and suitable for purposes of this invention include:
1,1-bis [p-chlorophenyl]-2,2,2-trichloroethane (DDT);
1,1-bis [p-methoxyphenyl]-2,2,2-trichloroethane;
1,2,3,6,9,10-hexabromocyclododecane;
1,10-dibromodecane;
1,1-bis[p-chloropehnyl]-2,2-dichloroethane;
4,4'-dichloro-2-(trichloromethyl) benzhydrol;

In Step 1 of the process of the subject invention, following application of the photoresist to the surface of the substrate or to a planarizing layer, it is dried in accordance with art recognized procedures. Baking is a preferred method for drying the resist layer.

Following formation of the dry photoresist coating, the next step in the process involves imaging the dry photoresist layer. Imaging comprises exposure of the photoresist coating to a source of actinic radiation through a master bearing a desired image pattern. The required exposure dose is dependent upon the photoresist used. Typically, exposure is to a source of monochromatic light within a wavelength of from about 190 to 465 nm at an exposure dose varying between about 10 and 1,000 millijoules per centimeter square, but may also be by x-ray, excimer laser, etc.

As discussed in greater detail below, only the surface layer of the photoresist coating need be removed in a subsequent development step though the photoresist may be developed to its full thickness if desired. Therefore, while in conventional processes, exposure is to an exposure dose sufficient to expose the photoresist coating through its full thickness, in the process of the subject invention using a positive photoresist coating, exposure of only the the surface of the photoresist coating is adequate. Therefore, broadly stated, the exposure dose for purposes of this invention varies from that necessary to form a latent image only within the surface of the photoresist coating to that necessary to expose the full thickness of the photoresist coating.

Exposure of the surface of the photoresist only as discussed above is a less preferred embodiment of the invention possible only with positive photoresists. Exposure through the entire photoresist layer is preferred though in the development step, as will be discussed below, it is preferred that only the surface of the photoresist be removed by the developer.

If a planarizing layer is used between the photoresist layer and the substrate, a thin photoresist layer may be used and the exposure dose need be sufficient to expose only this thin photoresist layer. Consequently, in this instance, exposure is to a source of activating radiation sufficient to expose the photoresist overlying the planarizing layer.

Following exposure of the photoresist layer, as recited in step 3 above, the surface of the exposed photoresist layer is catalyzed with an electroless metal plating catalyst, a step that precedes electroless metal deposition at a subsequent point in the process. Catalysis involves deposition of a material that is catalytic to electroless metal deposition onto the surface of the photoresist. The process of catalysis comprises contact, typically by immersion, of the substrate coated with the photoresist layer with an aqueous solution of the catalyst for a time sufficient to adsorb an adequate amount of catalyst onto the surface of the photoresist. Immersion times generally vary from about 30 seconds to 10 minutes in a solution varying in temperature from about room temperature to 50° C. or higher Catalyst compositions for electroless metal deposition are known to those skilled in the art and are disclosed in U.S. Pat. No. 3,011,920 incorporated herein by reference. The method of this patent comprises catalyzing a substrate by treatment with a bath containing colloidal particles formed by reducing a catalytic metal with tin. The catalytic metal is typically a precious metal and is most often palladium. The oxidation product of the tin salt is believed to form a protective colloid. Numerous improvements have been made in this process and in the composition of the colloidal catalyst bath as disclosed in, for example, U.S. Pat. Nos. 3,719,508; 3,728,137; 3,977,884; and 4,725,314. With respect to U.S. Pat. No. 4,725,314, there is described preparation of catalyst particles of dimensions not exceeding 500 angstroms (0.05 microns). For purposes of this invention, plating catalysts having particles of small dimension are preferred.

The next major step in the process of the invention, (step 4 above), involves development of preferably the top surface of the exposed and catalyzed photoresist layer only. As is known in the art, the object of the development step is to remove the exposed photoresist (positive) or unexposed (negative) regions of the photoresist coating at a faster rate than the background and in a reproducible and controlled manner. This is accomplished by contacting the photoresist coating with a developer. Development procedures and developer compositions are discussed in *Semiconductor Lithography*, supra, chapter 10. Using the diazo naphthoquinone-novolak positive acting photoresists for purposes of illustration, development is by contact with an aqueous alkaline developer solution such as an alkali metal hydroxide solution or a quaternary ammonium hydroxide solution. Developer strength and development time would be that required to remove (develop) the photoresist to a depth within the photoresist coating sufficient to remove at least the top surface of the coating and the catalyst adsorbed onto its surface where not desired so as to provide a catalyzed surface in a desired pattern.

Developers for negative photoresists include water, methanol, isopropanol, glycerol, diacetone alcohol, etc. dependent upon the particular negative photoresist used. As discussed above, and as is known in the art, specific developers are used for specific photoresist systems.

It is an advantage to the invention that development need not be to the full thickness of the photoresist coating, but adequate only to remove the top surface of the photoresist together with catalyst adsorbed onto the photoresist coating to provide a surface catalyzed in a desired image pattern. Surface development may be accomplished either using a dilute developer and/or a reduced development time. By removing only the top surface of the photoresist coating, problems frequently encountered with wet photoresist development, such as formation of a toe, or formation of tapered and enlarged openings are avoided, since prolonged contact with the developer solution is not required. Photoresist remaining as a consequence of incomplete development, in accordance with the invention, is removed during subsequent processing steps.

Though incomplete development is preferred, the photoresist may still be developed to the full thickness of the photoresist layer. In this embodiment of the invention, plasma etching will remove residual photoresist remaining following development, and the metal mask will still protect the underlying photoresist layer during plasma etching of the substrate.

Where a planarizing layer is utilized beneath the photoresist coating, the photoresist coating can be substantially thinner and development can be with a developer for the photoresist that is not a solvent for the planarizing layer. In this way, the photoresist is removed while the underlying planarizing layer may remain intact and the effect of intermixing of the layers is avoided.

Continuing with the process of the invention, the next step in the process, step 5, comprises deposition of electroless metal over the catalyst adsorbed on the surface of the photoresist coating in an image pattern. Metallization occurs using known electroless deposition procedures and may require a step of acceleration prior to metallization. Acceleration is in accordance with art recognized processes and can follow step 3, catalysis (most preferred), or step 4, development. Acceleration comprises contact of the catalyzed surface with a solvent for protective colloids formed during catalysis formation. It should be noted that not all catalysts require a step of acceleration. Acceleration is discussed in U.S. Pat. No. 3,011,920 referenced above.

A preferred method for acceleration believed to be novel, comprises contact of the catalyzed surface with a dilute solution of dissolved noble metal, preferably palladium dissolved in dilute hydrochloric acid solution. The use of such a solution results in substantial improvement in line acuity following metal deposition. A solution containing from about 0.01 to 5.0 weight percent of a salt of the noble metal is suitable, and preferably from about 0.1 to 2.0 weight percent.

Following acceleration, electroless metal is deposited over the catalyst layer in the image pattern. Electroless metal deposition refers to the chemical plating of a metal over a catalytically active surface by chemical reduction in the absence of an external electric current. Processes and compositions for electroless deposition of metals are known in the art and are in substantial commercial use. They are disclosed in a number of prior art patents, for example, copper plating solutions are disclosed in U.S. Pat. Nos. 3,615,732; 3,615,733; 3,728,137; 3,846,138; 4,229,218; and 4,453,904, incorporated herein by reference. Electroless nickel plating solutions are described in U.S. Pat. Nos. 2,690,401; 2,690,402; 2,762,723; 3,420,680; 3,515,564; and 4,467,067, all incorporated herein by reference. A large number of copper and nickel plating solutions are commercially available. Other metals that may be electrolessly deposited include gold, palladium and cobalt. Various alloys, such as copper and nickel alloys, are also capable of electroless metal deposition. The preferred electroless metals for purposes of this invention are copper and nickel.

Known electroless metal deposition solutions generally comprise four ingredients dissolved in water. They are (1) a source of metal ions, usually a metal salt such as copper or nickel sulfate, (2) a reducing agent such as formaldehyde for copper solutions, hypophosphite or dimethylamineborane for nickel solutions, (3) a pH adjustor such as hydroxide for copper solutions or an acid for nickel solutions and (4) one or more complexing agents for the metal sufficient to prevent its precipitation from solution Other additives are typically contained in such plating solutions such as stabilizers, exaltants, etc.

Electroless plating solutions are used for the process disclosed herein in the sam manner as for other industrial applications, though i preferred embodiment of the invention, significantly thinner coatings may be used compared to the thickness of the coating required for prior art applications. The purpose of the electroless metal deposit is to function as a mask for the underlying photoresist during plasma development. For this purpose, a metal deposit having a thickness varying between 20 and 5,000 angstroms, preferably between 50 and 1,000 angstroms is adequate. This compares to a deposit having a thickness of several mils for most conventional industrial applications for electroless metal deposits such as those used in the formation of printed circuit boards where thick deposits are required for conductivity, not as a barrier or mask.

The ability to attain plasma protection using thin metallic deposits is an advantage of the process of the invention as significantly shorter deposition times are possible and/or dilute plating solutions that are easily controllable may be used. In this respect, deposition times may range from several seconds to several minutes while commercial plating solutions may be diluted by up to 20 or more times normal dilution for purposes of the invention.

The next step in the process of the invention comprises dry development of that portion of the photoresist coating remaining following wet development that is not protected by the metal mask. In this respect, even if wet development is used to fully develop the image, dry development is still desired to remove residual photoresist following development. Any plasma that attacks organic material is suitable. Plasmas based on oxygen attack organic film such as photoresists and are preferred for purposes of this invention. A preferred means for dry development involves the use of an oxygen containing reactive ion etch to achieve anisotropic development. Dry development is continued until all of the extraneous photoresist is removed.

Following dry development of the photoresist coating, the metal mask may be removed if desired such as by etching in acid, but for most processes, this step is not necessary and not desirable. Thereafter, the substrate bared by dry development of the photoresist coating may be altered in any desired way. Alteration may include etching, metal deposition, doping, etc. Etching is a common method of altering the substrate in semiconductor device manufacture. For example, a plasma can be used for etching a semiconductor substrate and plasmas containing fluorine atoms, such as may be formed from $CF_4$, $SF_6$, or $NF_3$ may be used for etching silicon, silicon oxide or silicon nitride. Plasmas that produce chlorine and bromine atoms may also be used for this purpose, such as those based upon $Cl_2$, $Br_2$, $CCl_4$, a mixture of $Cl_2$ with $C_2F_6$, and similar compounds. Many metals are attacked by halogen plasmas, but by incorporation of a controlled amount of oxygen with the halogen containing gas, it is possible to etch silicon dioxide selectively in the presence of a mask such as nickel. Plasma etching of the substrate may immediately follow plasma etching without removal of the substrate from the etching chamber.

Details for plasma development and plasma etching are described in the literature including H. V. Boenig, *Plasma Science and Technology*, Cornell University Press, Ithaca, 1982; by J. A. Mucha and D. W. Hess, in *Introduction to Microlithography*, American Chemical Society, Washington, 1983; and by H. Kalter et al, *Plasma Etching in IC Technology*, Philips Tech. Rev. 38, No. 7/8, pp.200 to 210, 1978/79, all incorporated herein for their teachings of known methods for plasma development and etching.

Following plasma etching, the metal mask if not previously removed, and the underlying photoresist coating may be wet stripped with a conventional remover for the photoresist. If the metal mask was not removed, the dissolution of the photoresist results in lift off of the metal mask over the photoresist coating. Conventional solvents, or strippers as they are known in the art, are commercially available.

The process sequence set forth above is further illustrated by FIG. 1 of the drawings shown in exaggerated dimension. In FIG. 1, there is shown a starting material comprising substrate 10, which may be a semiconductor wafer such as silicon, covered by a layer of its oxide 11. In Step 1, the substrate 10 has a coating of photoresist 12 placed over oxide layer 11. The photoresist coating is applied by conventional means. In Step 2, the photoresist coating is exposed to actinic radiation in an image pattern through a mask 13. Thereafter, appropriate surface treatment of the photoresist may be required (not shown) prior to catalyzation, dependent upon the specific materials employed. As shown in Step 3, a catalyst layer 14 is applied over the photoresist coating 12. An acceleration step (not shown) may be employed to activate the catalyst, if required by the specific materials employed. Following catalysis, and acceleration if appropriate, exposed portions of the photoresist 12 are partially developed by brief contact with a wet developer as depicted in step 4. Catalyst 14 adsorbed onto photoresist coating 12 is removed by development together with dissolved photoresist leaving a catalytic surface with the catalyst forming a desired image pattern as shown in step 4. In step 5, an electroless metal deposit 15 is deposited over the catalytic layer 14 in the image pattern. The metal layer 15 in an image pattern is an effective mask against an oxygen containing plasma. In step 6, an oxygen containing plasma has been used to remove photoresist coating 12 remaining after the wet development step. The final step in the process comprises alteration of substrate 10. As shown in step 7, alteration takes place by etching, preferably dry etching. The invention will be better understood by reference to the following examples.

EXAMPLE 1

This Example utilizes wet development of a photoresist layer prior to its full thickness prior to deposition of an electroless metal. The purpose of the example is to illustrate the effectiveness of a metal mask as a barrier to a plasma stream. All chemicals identified by trade name or trademark used in the process were obtained from Shipley Company Inc. of Newton, Mass.

A 4 inch diameter silicon wafer was primed with hexamethyldisilazane, then spin-coated with a positive photoresist identified as Microposit® S1813 for 30 seconds at 4500 rpm, and then dried at 90° C. for 30 minutes, forming a coating having a thickness of 1.22 microns. This coating was exposed to ultraviolet radiation using a GCA DSW wafer stepper to expose successive portions under conditions known to give full exposure, namely, an energy level of approximately 100 mJ/cm$^2$ with appropriate depth of focus. To form a pattern, the radiation was passed through a GCA resolution reticle mask. The wafer was then immersed in an electroless plating precatalyst solution identified as Cataprep 404® pretreatment solution for 1 minute at 29.4° C. to prepare the surface for adsorption of the catalyst. Electroless plating catalyst Cataposit® 44 was then deposited from a 6% solution for 4 minutes at 48.9° C. After rinsing with deionized water, the catalyst was activated by treatment with Accelerator 240 for 1 minute at 35° C. Following a second rinse with deionized water, the photoresist was developed with Microposit® developer in a 1:1 dilution for 70 seconds at room temperature, to give full development of the exposed portions of the photoresist layer. Electroless nickel was then deposited on the wafer by treatment with Niposit® 468 (50% strength) for 40 seconds at a pH of between 7.5 and 7.9 at a temperature of 30° C. to form a nickel deposit in the desired image pattern. The thickness of the nickel layer was approximately 0.3 microns, as determined with a DekTak II-D Profilometer.

The formation of a patterned deposit of nickel demonstrate the capability of this process to control the areas of electroless deposition by photoimaging. The nickel film was rated as by visual observation with a light microscope at 100× magnification with a subjective quality rating of 9.5 on a scale of 0 to 10 though some nodularity was detectable.

EXAMPLE 2

In this Example, the silicon wafer was oxidized by heating in the presence of oxygen, forming a surface layer of SiO$_2$ of a thickness of 385 nm. Thereafter, the oxidized wafer was subjected to the same treatment steps as described in Example 1. The resulting patterned deposit of nickel was rated 9.5.

EXAMPLES 3 to 10

These Examples used a thermally oxidized silicon wafer prepared following the procedure of Example 2 and following the steps described in Example 1, but varying the concentration of nickel plating solution and the time of treatment with this plating solution. A development time of 60 seconds was used throughout.

| Example Number | Concentration Niposit 468 (volume %) | Ni Treatment minutes | Nickel Deposit Rating | Description |
|---|---|---|---|---|
| 3 | 5 | 3.0 | 0 | No deposit |
| 4 | 10 | 3.0 | 9.0 | Excellent |
| 5 | 25 | 3.0 | 5.0 | Rough |
| 6 | 10 | 2.0 | 9.0 | Slightly thin |
| 7 | 10 | 6.0 | 7.5 | Good |
| 8 | 5 | 9.0 | 9.5 | Excellent |
| 9 | 5 | 11.0 | 8.0 | Slightly rough |
| 10 | 5 | 15.0 | 5.0 | Rough |

From the above examples, it is seen that there exists an optimum range of concentrations of nickel plating solution and time of treatment with said solution. Too high a concentration, and/or too long a time of treatment, gives a rough (i.e., nodular) deposit of nickel. Too low a concentration, together with too short a time of treatment gives too thin a deposit of nickel, or in an extreme case, no deposit at all.

EXAMPLES 11 to 18

These Examples were performed on an untreated silicon wafer using the procedures of Example 1, but varying the time of treatment with the nickel plating solution.

From Examples 3 to 10, it was determined that the best quality nickel deposit was obtained with a dilute electroless plating solution. Therefore a concentration of 5% Niposit ® 468 electroless nickel plating solution was employed for these examples. A development time of 65 seconds was used throughout, with the exception of Examples 16 to 18 where a development time of 60 seconds was used. To test the efficacy of the nickel deposit for microlithography with plasma etching, plating was followed by reactive ion etching (RIE) using an oxygen plasma generated by a Magnetron using a treatment time of 345 seconds at a power level of 2000 W. The wafer was then examined with a scanning electron microscope (SEM), and thickness was determined by Rutherford Backscattering spectometry with results as set forth below.

| Example Number | Treatment time (min.) | Deposit Thickness (Angstroms) | Description of Ni Mask and Resist Following RIE |
|---|---|---|---|
| 11 | 2.0 | 13 | No mask, resist removed. |
| 12 | 4.0 | 90[1] | No mask, resist partially removed. |
| 13 | 4.5 | 92 | Good mask, resist slightly etched. |
| 14 | 5.5 | 55.3 | Excellent mask, including 0.6 micron lines, resist intact. |
| 15 | 6.0 | 77 | Good mask, resist intact. |
| 16 | 7.0 | 55 | Good mask, resist intact. |
| 17 | 7.5 | 90 | Good mask, resist intact. |
| 18 | 8.0 | 73 | Slightly rough nickel mask, resist intact. |

[1] Based upon the results observed, it is believed that an error was made in determining the thickness of the deposit.

Based on Examples 13 to 17, it can be concluded that desirable conditions for these examples include deposition of Niposit ® 468 electroless nickel at 5% strength at a temperature of 30° C. without agitation for a period of 4.5 to 7.5 minutes. A significantly shorter time leads to a nickel mask which is noncontinuous and is therefore unable to fully protect the photoresist from reactive ion etching with an oxygen plasma. A significantly longer time leads to a rough nickel deposit with inferior resolution. Optimum results were obtained with 5.5 minutes of deposition time (Example 14) which exemplifies the most preferred embodiment of this invention. Based on measurements using Rutherford Backscattering spectrometry, it is believed that in this Example, the average thickness of the nickel deposit is of the order of 0.01 micron; i.e., somewhat thicker than the particle diameter of the colloidal catalyst used as the plating catalyst, which is known to be primarily in the range 0.005 to 0.01 micron. The extreme thinness of this nickel deposit permits precise definition of its edges, with minimum nodularity, while still affording protection against an oxygen containing RIE.

EXAMPLES 19 to 24

These Examples illustrate the process with partial development prior to deposition of metal.

In these Examples, a thermally oxidized silicon wafer was used having an oxide layer thickness of 500 nm. The wafer was primed with hexamethyldisilazane and then spin coated with a positive photoresist identified as Microposit ® S1822 photoresist at spin speed of 1500 rpm and then dried on a hot plate at 115° C. for 60 seconds. The dried photoresist layer was 3.6 microns in thickness. The wafer was exposed to UV radiation as in Example 1. Succeeding steps were carried out as in Example 1 with the exceptions that the step of immersion in Cataprep ® ±5° C. was used for treatment with all solutions. Further specification of the treatment conditions is given in the table below.

In these Examples, SEM examination established that the exposed portions of photoresist were removed by developer to a depth of 1.5 microns and, where the layer was initially 3.6 microns thick, development is considered partial development. The thickness of nickel deposited after various times was interpolated on a plot of thickness vs. deposition time, measured in a separate series of experiments by means of Rutherford Backscattering Spectrometry using 2MeV helium ions.

To test the efficacy of the nickel films for protection of the photoresist, the wafer was subjected, first to RIE with oxygen in order to remove the photoresist in the unprotected portions, and then to a halogen containing plasma to etch the silicon dioxide. Inspection after each treatment gave the results shown in the following table where "quality" refers to the appearance of the edges of the nickel film: "good" indicating fairly smooth edges while "poor" indicates rough edges.

| Example Number Plasma | Time of Treatment (min) | | | Deposit Thickness(nm) | Quality After RIE |
|---|---|---|---|---|---|
| | Catalyst | Photoresist in Developer | Niposit | | |
| 19 | 4.0 | 1.00 | 4.0 | 6.0 | Poor |
| 20 | 4.0 | 1.33 | 4.0 | 6.0 | Good |
| 21 | 4.0 | 1.67 | 4.0 | 6.0 | Poor |
| 22 | 4.0 | 1.83 | 7.5 | 9.5 | Good |
| 23 | 2.0 | 2.00 | 5.0 | 7.0 | Poor |
| 24 | 3.0 | 2.00 | 5.0 | 7.0 | Good |

In all of Examples 19 to 24, the nickel layer protected the photoresist (together with underlying substrate) during anisotropic etching, both by an oxygen RIE and by an etchant for silicon dioxide. This establishes the feasibility of this embodiment of the invention.

Examples 19 to 21 show that under the conditions used, a development time of 1.33 minutes is optimum. Examples 22 to 24 were carried out with wafers which had been aged for 2 days after coating with photoresist, therefore the results are not strictly comparable with those of Examples 19 to 21 in which freshly coated wafers were used. These examples show that good edge formation is not restricted to a single set of conditions, but the conditions must be established using routine experimentation.

EXAMPLE 25

This Example illustrates a preferred embodiment of the invention. Under optimum conditions, the processes used in the foregoing Examples gave etch resistant masks of good quality and of resolution adequate for microlithography as currently practiced. However, these processes generated some particles, predominantly in the range 0.2 to 2.0 microns which degraded image resolution. This Example in part demonstrates that particles may be removed by washing with dilute acid immediately following deposition of catalyst, yielding a mask of superior cleanliness and resolution.

A silicon wafer primed with hexamethyldisilazane was spin-coated with a positive Microposit ® S1400-31 photoresist to form a film having a thickness of 1.5 microns. The coated substrate was exposed to patterned UV radiation as in Example 1. The exposed substrate was then treated in the following manner, all steps being carried out at 20° C. using filtered solutions:

1' Cataposit ® 44 catalyst, 4 minutes, with agitation;

2) Hydrochloric acid (2%) rinse, 2 minutes, with mild agitation;
3) Accelerator 240, 1 minute, with agitation;
4) Rinse with deionized water, 2 minutes;
5) Microposit ® developer (1:1), 1 minute, with paddle agitation;
6) Rinse with deionized water, 2 minutes;
7) Niposit ® 468 electroless nickel (10%), 5 minutes, with no agitation.

Examination of the wafer established that the nickel film was of excellent quality.

EXAMPLE 26

The procedure of Example 25 may be repeated using an electroless copper plating solution and a photoresist that is not attacked by strong alkali solutions.

EXAMPLES 27 to 32

The following examples illustrate the process of the invention utilizing a palladium chloride accelerator solution The examples constitute the most preferred embodiment of the invention.

Silicon wafers primed with hexamethyldisilzzone were spin coated with a positive Microposit ® S-1813 photoresist to form a film having a thickness of 1.2 microns following drying. The coated substrates were exposed to patterned radiation as in Example 1 and then treated in the following manner, all steps being carried out at 20° C. using filtered solutions:

1) Cataposit ® 44 catalyst, 4 minutes, with agitation;
2) Accelerator—0.1 gm/l $PdCl_2$ in 2% HCl solution, 3 minutes.
3) Rinse with deionized water, 2 minutes;
4) Microposit ® developer (1:1), 1 minute, with paddle agitation;
5) Rinse with deionized water, 2 minutes;
6) Niposit ® 468 electroless nickel (5%), time variable, with no agitation.

One hundred percent nickel coverage of the resist in an image pattern was obtained for all examples. Time of plating and comments relating to deposit properties are set forth below.

| Example No. | Time in Nickel (min) | Deposit Thickness(nm) | Comments |
|---|---|---|---|
| 27 | 5.0 | 6 | Excellent |
| 28 | 10.0 | 9 | Good |
| 29 | 6.5 | 7 | Excellent |
| 30 | 8.0 | 8 | Good |
| 31 | 15.0 | 11 | Excellent |
| 32 | 20.0 | 15 | Fair |

The results set forth above were in general superior to results obtained in Example 25 using a standard accelerator.

We claim:

1. A process for forming a metal mask over a photoresist coating, said process comprising the steps of:
   (a) forming a coating of a photoresist over a substrate; and then in either order,
   (b) exposing said coating of photoresist to patterned radiation at an energy dose sufficient to form a latent image in said photoresist coating; and
   (c) forming sites on said photoresist coating catalytic to electroless metal deposition;
   and then,
   (d) developing said photoresist coating with a developer for said exposed photoresist coating whereby photoresist together with catalytic sites are removed by contact with the developer in the exposed areas if the photoresist is a positive working photoresist or in the unexposed areas if the photoresist is a negative working photoresist whereby there is formed an imaged pattern of sites catalytic to electroless metal deposition on said photoresist coating; and p1 (e) electrolessly depositing metal over said imaged pattern of catalytic sites to a thickness of at least 20 angstroms.

2. The process of claim 1 where the sequence of steps comprises exposing the photoresist coating to patterned radiation prior to forming catalytic sites on the photoresist coating.

3. The process of claim 1 where the sequence of steps comprises forming catalytic sites on the photoresist coating prior to exposing the photoresist coating to patterned radiation.

4. The process of claim 1 including the step of forming a planarizing layer between the substrate and the photoresist coating prior to forming the coating of the photoresist on the substrate.

5. The process of claim 4 where the planarizing layer and the photoresist coating have a combined thickness varying between 0.1 and 500 microns.

6. The process of claim 5 where the combined thickness varies between 0.5 and 50 microns.

7. The process of claim 1 where the photoresist coating has a thickness varying between 0.1 and 5 microns.

8. The process of claim 4 where the planarizing layer is light sensitive.

9. The process of claim 4 where the planarizing layer is light insensitive.

10. The process of claim 1 where the photoresist is a positive acting photoresist.

11. The process of claim 10 where the photoresist comprises a diazo sensitizer in a polymeric binder selected from the group of novolak resins and polyvinyl phenol resins.

12. The process of claim 1 where the photoresist is a negative acting photoresist.

13. The process of claim 12 where the photoresist is an acid hardening resist comprising a phenolic resin, an acid generator and an aminoplast.

14. The process of claim 1 where catalytic sites are formed on the photoresist coating by contact of the coating with an aqueous solution of an electroless metal plating catalyst.

15. The process of claim 14 where the electroless plating catalyst is a tin palladium catalyst.

16. The process of claim 14 where the catalyst is accelerated by contact with a palladium ion solution.

17. The process of claim 1 where the photoresist coating is partially developed to a depth sufficient to remove catalytic sites overlying the photoresist to form an image pattern of catalytic sites.

18. The process of claim 1 where the electroless metal is selected from the group of copper and nickel.

19. The process of claim 18 where the electroless metal is nickel.

20. The process of claim 18 where the electroless metal is copper.

21. The process of claim 18 where the thickness of the electroless metal deposit is at least 50 angstroms.

22. The process of claim 21 where the thickness varies between 50 and 1,000 angstroms.

23. The process of claim 17 including the step of dry development of remaining photoresist following partial development and electroless metal deposition.

24. The process of claim 23 where dry development is with an anisotropic reactive ion etch.

25. A process for altering the surface of a substrate comprising the steps of:
   (a) forming a dry coating of a photoresist over said substrate;
   and then in either order,
   (b) exposing said coating of photoresist to patterned radiation at an energy dose sufficient to form a latent image in said photoresist coating; and
   (c) forming sites on said photoresist coating catalytic to electroless metal deposition;
   and the,
   (d) developing the surface of said photoresist coating with a developer for said exposed photoresist coating whereby photoresist together with catalytic sites are removed by contact with the developer in the exposed areas if the photoresist is a positive working photoresist or in the unexposed areas if the photoresist is a negative working photoresist whereby there is formed an imaged pattern of sits catalytic to electroless metal deposition on said photoresist coating;
   (e) electrolessly depositing metal over said imaged pattern of catalytic sites to a thickness of at least 20 angstroms;
   (f) dry developing photoresist free of the electroless metal coating; and
   (g) altering the surface of the substrate bared by dry development of the photoresist.

26. The process of claim 25 where the sequence of steps comprises exposing the photoresist coating to patterned radiation prior to forming catalytic sites on the photoresist coating.

27. The process of claim 25 where the sequence of steps comprises forming catalytic sites on the photoresist coating prior to exposing the photoresist coating to patterned radiation.

28. The process of claim 25 including the step of forming a planarizing layer between the substrate and the photoresist coating prior to forming the coating of the photoresist on the substrate.

29. The process of claim 28 where the planarizing layer and the photoresist coating have a combined thickness varying between 5 and 50 microns.

30. The process of claim 25 where the photoresist coating has a thickness varying between 0.1 and 5 microns.

31. The process of claim 21 where the photoresist is a positive acting photoresist.

32. The process of claim 31 where the photoresist comprises a diazo sensitizer in a polymeric binder selected from the group of novolak resins and polyvinyl phenol resins.

33. The process of claim 25 where the photoresist is a negative acting photoresist.

34. The process of claim 33 where the photoresist is an acid hardening resist comprising a phenolic resin, an acid generator and an aminoplast.

35. The process of claim 25 where catalytic sites are formed on the photoresist coating by contact of the coating with an aqueous solution of an electroless metal plating catalyst.

36. The process of claim 35 where the electroless plating catalyst is a tin palladium catalyst.

37. The process of claim 25 where the electroless metal is selected from the group of copper and nickel.

38. The process of claim 37 where the electroless metal is nickel.

39. The process of claim 37 where the thickness of the electroless metal deposit is at least 50 angstroms.

40. The process of claim 39 where the thickness varies between 50 and 1,000 angstroms.

41. The process of claim 25 where the step of dry development of the photoresist following electroless metal deposition is by anisotropic reactive ion etching.

42. The process of claim 25 where the substrate is a semiconductor.

43. The process of claim 42 where the semiconductor is silicon coated with silicon dioxide.

44. The process of claim 42 where the substrate is altered by implantation.

* * * * *